United States Patent
Wang et al.

(10) Patent No.: US 11,404,263 B2
(45) Date of Patent: Aug. 2, 2022

(54) DEPOSITION OF LOW-STRESS CARBON-CONTAINING LAYERS

(71) Applicant: Applied Materials, Inc., Santa Clara, CA (US)

(72) Inventors: Huiyuan Wang, Santa Clara, CA (US); Rick Kustra, San Jose, CA (US); Bo Qi, San Jose, CA (US); Abhijit Basu Mallick, Fremont, CA (US); Kaushik Alayavalli, Sunnyvale, CA (US); Jay D. Pinson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/987,666

(22) Filed: Aug. 7, 2020

(65) Prior Publication Data

US 2022/0044926 A1   Feb. 10, 2022

(51) Int. Cl.
  *H01L 21/02*   (2006.01)
  *C23C 16/26*   (2006.01)

(52) U.S. Cl.
  CPC .. *H01L 21/02115* (2013.01); *H01L 21/02205* (2013.01); *H01L 21/02271* (2013.01); *C23C 16/26* (2013.01)

(58) Field of Classification Search
  None
  See application file for complete search history.

(56) References Cited

U.S. PATENT DOCUMENTS

| 8,435,608 | B1 | 5/2013 | Subramonium et al. |
| 9,721,784 | B2 * | 8/2017 | Behera ............ H01L 21/02115 |
| 2010/0093187 | A1 * | 4/2010 | Lee .................. H01L 21/3146 438/780 |

(Continued)

FOREIGN PATENT DOCUMENTS

| KR | 2008-0102928 A | 11/2008 |
| TW | 201204862 A | 2/2012 |
| TW | 201809339 A | 3/2018 |

OTHER PUBLICATIONS

International Search Report and Written Opinion dated Nov. 18, 2021 in International Patent Application No. PCT/US2021/043261, 9 pages.

*Primary Examiner* — Andres Munoz
(74) *Attorney, Agent, or Firm* — Kilpatrick Townsend & Stockton LLP

(57) ABSTRACT

Examples of the present technology include semiconductor processing methods that provide a substrate in a substrate processing region of a substrate processing chamber, where the substrate is maintained at a temperature less than or about 50° C. An inert precursor and a hydrocarbon-containing precursor may be flowed into the substrate processing region of the substrate processing chamber, where a flow rate ratio of the inert precursor to the hydrocarbon-containing precursor may be greater than or about 10:1. A plasma may be generated from the inert precursor and the hydrocarbon-containing precursor, and a carbon-containing material may be deposited from the plasma on the substrate. The carbon-containing material may include diamond-like-car- (Continued)

bon, and may have greater than or about 60% of the carbon atoms with $sp^3$ hybridized bonds.

17 Claims, 5 Drawing Sheets

(56) References Cited

U.S. PATENT DOCUMENTS

| | | | |
|---|---|---|---|
| 2012/0015521 A1* | 1/2012 | Yu | H01L 21/0337 438/703 |
| 2014/0170853 A1* | 6/2014 | Shamma | H01L 21/0338 438/699 |
| 2015/0064365 A1 | 3/2015 | Pitcher et al. | |
| 2016/0053366 A1* | 2/2016 | Stowell | C23C 16/272 204/192.15 |
| 2017/0103893 A1* | 4/2017 | Kulshreshtha | H01L 21/0332 |
| 2018/0358222 A1* | 12/2018 | Venkatasubramanian | H01L 21/31111 |
| 2019/0385907 A1* | 12/2019 | Gottheim | H01L 21/76837 |

* cited by examiner

DEPOSITION OF LOW-STRESS CARBON-CONTAINING LAYERS

TECHNICAL FIELD

The present technology relates to methods and systems for semiconductor processing. More specifically, the present technology relates to systems and methods for producing low-stress, carbon-containing layers or semiconductor substrates.

BACKGROUND

Integrated circuits are made possible by processes which produce intricately patterned material layers on substrate surfaces. Producing patterned material on a substrate requires controlled methods for forming and removing material. As device sizes continue to reduce, film characteristics may lead to larger impacts on device performance. Materials used to form layers of materials may affect operational characteristics of the devices produced. As material thicknesses continue to reduce, as-deposited characteristics of the films may have a greater impact on device performance.

Thus, there is a need for improved systems and methods that can be used to produce high quality devices and structures. These and other needs are addressed by the present technology.

SUMMARY

Embodiments of the present technology include semiconductor processing methods that may include providing a substrate in a substrate processing region of a substrate processing chamber, where the substrate is maintained at a temperature less than or about 50° C. The methods may further include flowing an inert precursor and a hydrocarbon-containing precursor into the substrate processing region of the substrate processing chamber, where a flow rate ratio of the inert precursor to the hydrocarbon-containing precursor is greater than or about 10:1. A plasma may be generated from the inert precursor and the hydrocarbon-containing precursor, and a carbon-containing material may be deposited from the plasma on the substrate.

In exemplary embodiments, the hydrocarbon-containing precursor may be flowed at a flow rate of less than or about 50 standard cubic centimeters per minute (sccm). Exemplary hydrocarbon-containing precursors may include acetylene, among other hydrocarbons. The inert precursor may be flowed at a flow rate of more than about 1000 sccm, and exemplary inert precursors may include helium and argon. The hydrocarbon-containing precursor and inert precursor may come together in the substrate processing region of the substrate processing chamber to form a plasma characterized by a pressure of less than or about 100 mTorr. Plasma effluents from the plasma may be accelerated towards the substrate by delivering a bias power to the substrate from a power source. The bias power may be greater than 2000 Watts. The as-deposited carbon-containing material on the substrate surface may be characterized by a stress less than or about −500 MPa.

Additional embodiments of the semiconductor processing methods may include providing a substrate in a substrate processing region of a substrate processing chamber, where the substrate is maintained at a temperature less than or about 50° C. A bias power may be delivered to the substrate from a power source, where the bias power is greater than 3000 Watts. The methods may further include generating a plasma from a deposition precursor comprising a hydrocarbon-containing precursor in the substrate processing region of the substrate processing chamber, and depositing a carbon-containing material from the plasma on the substrate.

In exemplary embodiments, the bias power delivered to the substrate from the power source may be greater than or about 4000 Watts, and may be characterized by an operating frequency of less than or about 13.56 MHz. The deposition precursor may further include an inert precursor combined with the hydrocarbon-containing precursor. A flow rate of the inert precursor may be greater than a flow rate for the hydrocarbon-containing precursor, and a flow rate ratio of the inert precursor to the hydrocarbon-containing precursor may be greater than or about 10:1.

Still additional embodiments of the semiconductor processing methods may include generating a plasma from a hydrocarbon-containing precursor in the substrate processing region of the substrate processing chamber, and depositing a carbon-containing material from the plasma on a substrate in the substrate processing region of the substrate processing chamber. The carbon-containing material may be characterized an as-deposited stress that is less than or about −500 MPa.

In exemplary embodiments, the substrate may be characterized by a temperature of less than or about 50° C. during the deposition of the carbon-containing material. The plasma may also be generated from an inert precursor that may include at least one of helium or argon. A flow rate ratio of the inert precursor to the hydrocarbon-containing precursor may be greater than or about 10:1. The as-deposited carbon-containing material may include greater than or about 60% of the carbon atoms having bonds with $sp^3$ hybridization, and less than or about 25 mol % hydrogen. In exemplary embodiments, the as-deposited carbon-containing material may be diamond-like carbon.

Such technology may provide numerous benefits over conventional systems and techniques. For example, embodiments of the present technology produce as-deposited carbon hardmasks with low stress that do not significantly bend or distort adjacent substrate features. Additionally, embodiments include low-stress, diamond-like carbon layers that have a high-modulus and high uniformity. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
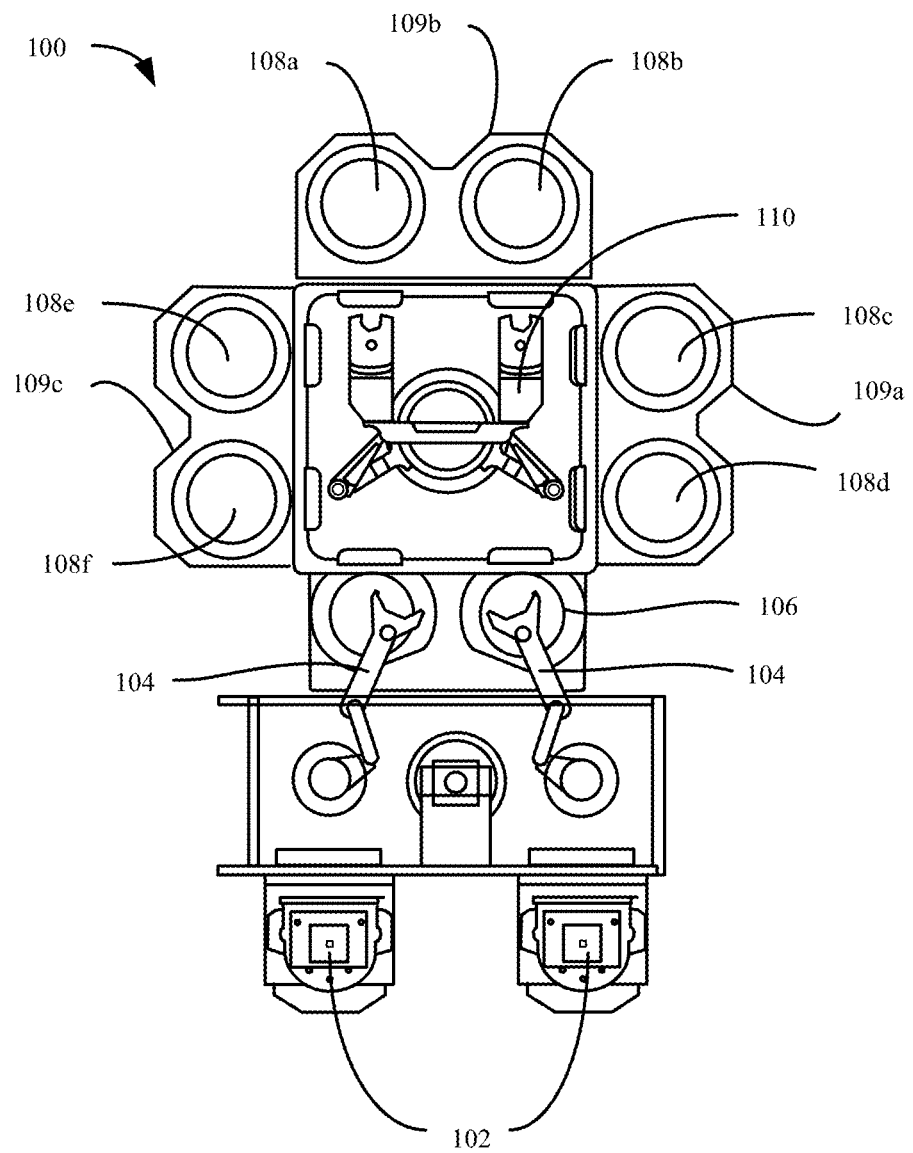
FIG. 1 shows a top view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and process methods for depositing low-stress layers of carbon-containing materials on a semiconductor substrate. Embodiments of these systems and methods address the problem of forming these materials in and around substrate features of increasing depths and narrower widths. Conventional systems and methods of depositing carbon-containing materials, such as carbon-containing hardmasks, produce layers having significant amounts of stress (e.g., stress levels of less than or about −1000 MPa, where a more negative the stress value represents a greater exertion of compressive force by the material). As these high-stress materials are deposited over surface features that may already be characterized by high stress, further problems may occur. For example, in one exemplary scenario, carbon hardmask films may be formed over 3D NAND placeholder structures to facilitate memory hole formation, stair step structure for contact formation, or other processing. 3D NAND stack pairs may be characterized by high stress from the many cell material layer pairs, and the incoming substrate may already show a compressive bowing. As 3D NAND stacks increase in pairs, in order to etch through the greater stacks, thicker hardmasks may be used. However, as the mask thickness increases, the increased stress may cause the structure to bend, the mask to fracture, and the device to ultimately fail. Consequently, many conventional mask materials cannot accommodate processing for advanced memory structures.

Alleviating the stress by replacing or eliminating carbon-containing layers that act as hardmasks during the patterning and etching of device features in and on a substrate is problematic. Carbon-containing hardmasks are typically deposited between underlying substrate materials and overlying energy-sensitive resist layer (e.g., a photoresist layer). The hardmask provides selective resistance to the etchants used to form features in the underlying substrate materials according to the pattern created in the energy-sensitive resist layer. If the hardmask layer were eliminated, the etchants would attack portions of the substrate feature intended to stay intact, resulting in the erosion and possible destruction of the features.

The present technology addresses these problems, among others, by providing systems and process methods to deposit a low-stress carbon-containing material on a substrate that can act as a carbon-containing hardmask, among other functions. Embodiments of the systems and methods deposit low-stress, carbon-containing materials by maintaining one or more process parameters that operate in conjunction to reduce hydrogen incorporation, improve carbon bonding structures, and lower film stress. Some of these parameters to be described below include the substrate temperature, the flow rate ratio of inert precursors to hydrocarbon-containing precursors that help form a deposition plasma, and the bias power used to generate the deposition plasma, among other process parameters.

The present technology may improve the deposition of carbon atoms with $sp^3$ hybridization and a material with lower amounts of hydrogen. The increased amount of carbon atoms with $sp^3$ hybridization increases the network of covalently crosslinked carbon-carbon single bonds, which may give the as-deposited material the characteristics of a diamond-like-carbon (DLC) layer. In contrast, materials favoring carbons with $sp^2$ hybridization may give an as-deposited layer with more graphite-like-carbon characteristics. Diamond-like-carbon has a more isotropic distribution of carbon-carbon bond lengths and strengths compared to graphite-like-carbon, where in-plane bonds are shorter and stronger than the orthogonal bonds outside the plane. As a result, the diamond-like-carbon layers are deposited with lower stress than graphite-like-carbon layers. Thus, the present technology, among other features, permits the deposition of low-stress carbon-containing layers that can function as hardmasks in deep and narrow substrate gaps without causing the bending, fracturing and failure of the adjacent substrate features (e.g., film stacks).

Although the remaining disclosure will routinely identify specific deposition processes utilizing the disclosed technology, it will be readily understood that the systems and methods are equally applicable to other deposition and treatment processes as may occur in the described chambers or any other chamber. Accordingly, the present technology may be implemented in a variety of chemical-vapor-deposition chambers, and should not be considered to be so limited as for use with these specific deposition processes or chambers alone. The disclosure will discuss one possible system and chamber that may be used in performing process methods according to some embodiments of the present technology before additional variations and adjustments to this system according to embodiments of the present technology are described.

FIG. 1 shows a top plan view of one embodiment of a semiconductor processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2A:
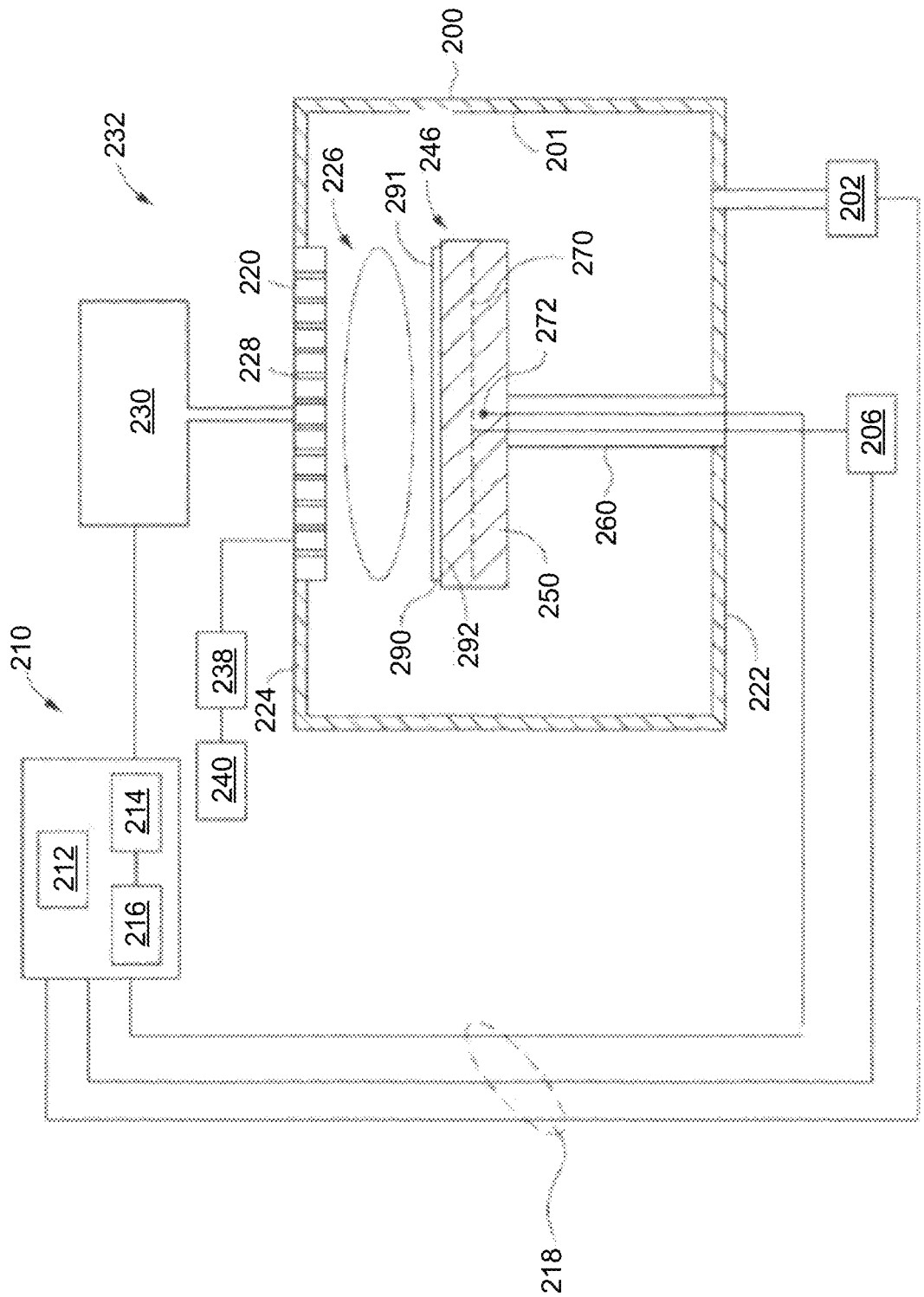
FIG. 2A shows a schematic cross-sectional view of an exemplary semiconductor processing chamber according to some embodiments of the present technology.
Figure 2B:
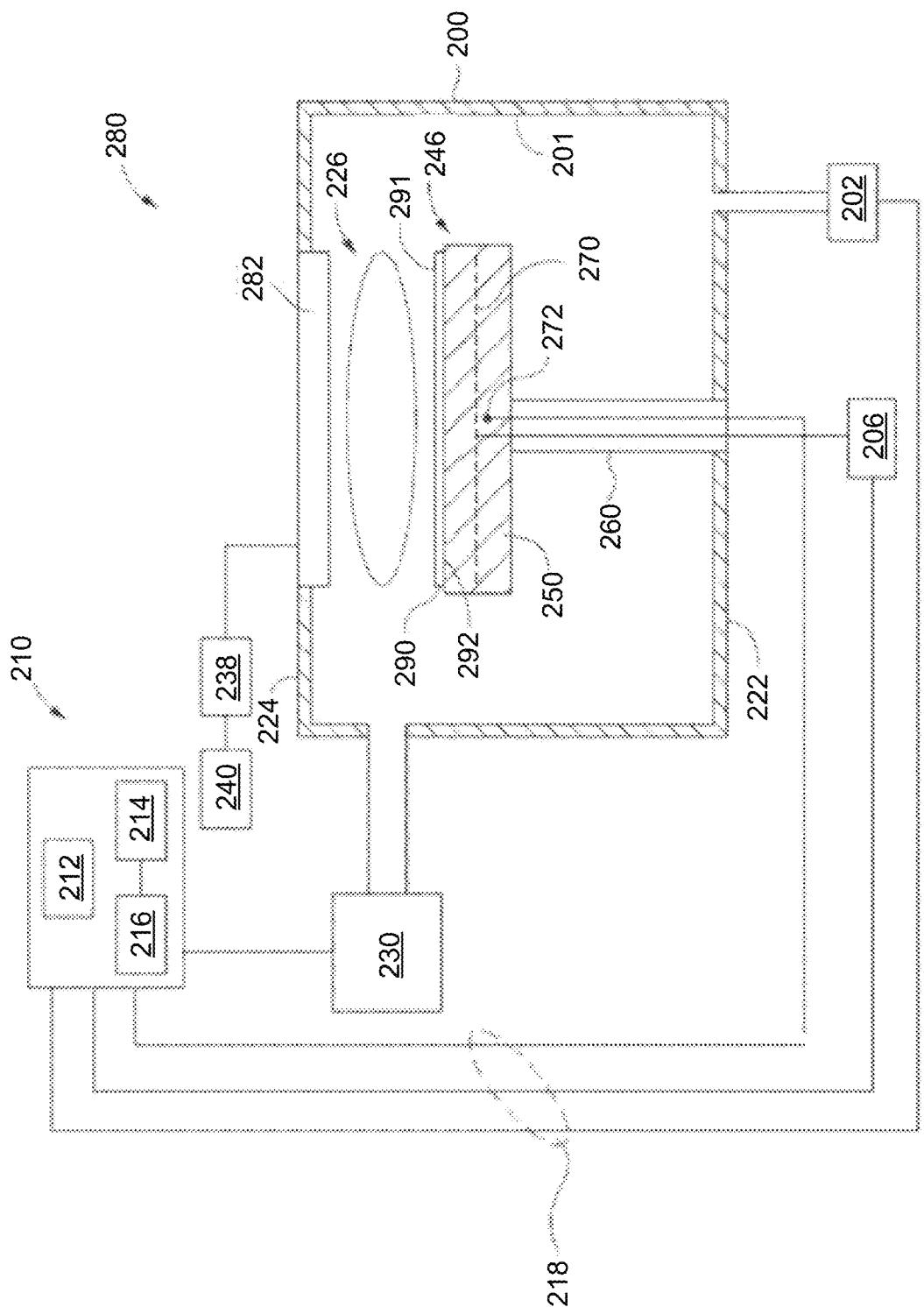
FIG. 2B shows a schematic cross-sectional view of an additional exemplary semiconductor processing chamber according to some embodiments of the present technology.

FIGS. 2A and 2B show a schematic cross-sectional views of an exemplary semiconductor processing systems 232 and 280 according to some embodiments of the present technology. The figures may illustrate an overview of systems incorporating one or more aspects of the present technology, and/or which may be specifically configured to perform one or more operations according to embodiments of the present technology. Additional details of the systems 232 and 280, and methods performed, may be described further below. Systems 232 and 280 may be utilized to form carbon-containing layers, such as carbon hardmasks, according to some embodiments of the present technology, although it is to be understood that the methods may similarly be performed in any system within which layer formation may occur.

Referring now to FIG. 2A, the semiconductor processing system 232 includes semiconductor processing chamber 200, which may include a top wall 224, a sidewall 201 and a bottom wall 222 that define a substrate processing region 226. A gas panel 230 and a controller 210 may be coupled to the processing chamber 200. A substrate support assembly 246 may be provided in the substrate processing region 226 of the process chamber 200.

The substrate support assembly 246 may include an electrostatic chuck 250 supported by a stem 260. The electrostatic chuck 250 may be fabricated from aluminum, ceramic, and other suitable materials such as stainless steel. The electrostatic chuck 250 may be moved in a vertical direction inside the process chamber 200 using a displacement mechanism (not shown). A temperature sensor 272, such as a thermocouple, may be embedded in the electrostatic chuck 250 to monitor the temperature of the electrostatic chuck 250. The measured temperature may be used by the controller 210 to control the power supplied to the heater element 270 to maintain the substrate at a desired temperature.

A vacuum pump 202 may be coupled to a port formed in the bottom of the process chamber 200. The vacuum pump 202 may be used to maintain a desired gas pressure in the process chamber 200. The vacuum pump 202 also evacuates post-processing gases and by-products of the process from the process chamber 200.

A gas distribution assembly 220 having a plurality of apertures 228 may be disposed on the top of the process chamber 200 above the electrostatic chuck 250. The apertures 228 of the gas distribution assembly 220 are utilized to introduce process gases into the process chamber 200. The apertures 228 may have different sizes, number, distributions, shape, design, and diameters to facilitate the flow of the various process gases for different process requirements. The gas distribution assembly 220 is connected to the gas panel 230 that allows various gases to flow to the processing volume 226 during processing. A plasma is formed from the process gas mixture exiting the gas distribution assembly 220 to enhance thermal decomposition of the process gases resulting in the deposition of material on a top surface 291 of a substrate 290 positioned on the electrostatic chuck 250.

The gas distribution assembly 220 and the electrostatic chuck 250 may form a pair of spaced apart electrodes in the processing volume 226. One or more RF power sources 240 provides a bias potential through a matching network 238, which is optional, to the gas distribution assembly 220 to facilitate generation of plasma between the gas distribution assembly 220 and the electrostatic chuck 250. Alternatively, the RF power source 240 and the matching network 238 may be coupled to the gas distribution assembly 220, the electrostatic chuck 250, or coupled to both the gas distribution assembly 220 and the electrostatic chuck 250, or coupled to an antenna (not shown) disposed exterior to the process chamber 200. In some embodiments, the RF power source 240 may produce power at a frequency of greater than or about 100 KHz, greater than or about 500 KHz, greater than or about 1 MHz, greater than or about 10 MHz, greater than or about 20 MHz, greater than or about 50 MHz, greater than or about 100 MHz, among other frequency ranges. Specific examples of frequencies of the power produced by RF power source 240 include 350 KHz, 2 MHz, 13.56 MHz, 27 MHz, 40 MHz, 60 MHz, 100 MHz, and 162 MHz, among other frequencies.

The controller 210 includes a central processing unit (CPU) 212, a memory 216, and a support circuit 214 utilized to control the process sequence and regulate the gas flows from the gas panel 230. The CPU 212 may be of any form of a general-purpose computer processor that may be used in an industrial setting. The software routines can be stored in the memory 216, such as random access memory, read only memory, floppy, or hard disk drive, or other form of digital storage. The support circuit 214 is coupled to the CPU 212 and may include cache, clock circuits, input/output systems, power supplies, and the like. Bi-directional communications between the controller 210 and the various components of the substrate processing system 232 are handled through numerous signal cables collectively referred to as signal buses 218, some of which are illustrated in FIG. 2A.

FIG. 2B depicts a schematic cross-sectional view of another substrate processing system 280 that can be used for the practice of embodiments described herein. The substrate processing system 280 is similar to the substrate processing system 232 of FIG. 2A, except that the substrate processing system 280 is configured to radially flow processing gases from gas panel 230 across the top surface 291 of the substrate 290 via the sidewall 201. In addition, the gas distribution assembly 220 depicted in FIG. 2A is replaced with an electrode 282. The electrode 282 may be configured for secondary electron generation. In one embodiment, the electrode 282 is a silicon-containing electrode.

Figure 3:
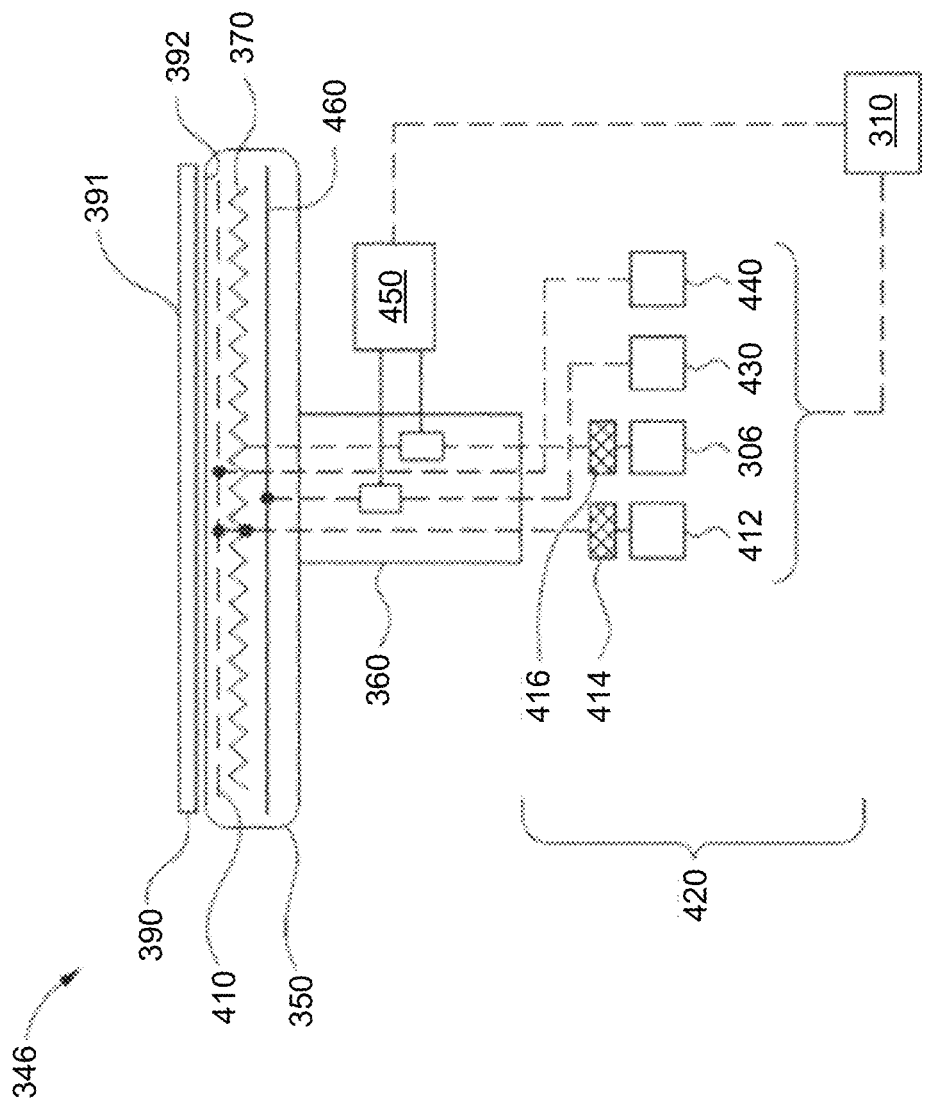
FIG. 3 shows a schematic cross-sectional view of an exemplary substrate support and electrostatic chuck according to some embodiments of the present technology.

FIG. 3 depicts a schematic cross-sectional view of the substrate support assembly 346 that may be used in embodiments of the systems. The substrate support assembly 346 may include an electrostatic chuck 350, which may include a heater element 370 suitable for controlling the temperature of the substrate 390 supported on an upper surface 392 of the electrostatic chuck 350. The heater element 370 may be embedded in the electrostatic chuck 350. The electrostatic chuck 350 may be resistively heated by applying an electric current from a heater power source 306 to the heater element 370. The heater power source 306 may be coupled through an RF filter 316 to protect the heater power source 306 from RF energy. The electric current supplied from the heater power source 306 is regulated by the controller 310 to control the heat generated by the heater element 370, thus maintaining the substrate 390 and the electrostatic chuck 350 at a substantially constant temperature during film deposition. The supplied electric current may be adjusted to selectively control the temperature of the electrostatic chuck 350 between about 20° C. to about 350° C. during deposition of a carbon-containing film on the substrate. A cooling unit (not shown) may also be thermally coupled to the substrate support assembly 346 to selectively control the temperature of the substrate 390 to a temperature between about −50° C. to about 20° C.

In some embodiments, the electrostatic chuck 350 includes a chucking electrode 410, which may be a mesh of a conductive material. The chucking electrode 410 may be embedded in the electrostatic chuck 350. The chucking electrode 410 is coupled to a chucking power source 412 that, when energized, electrostatically clamps the substrate 390 to the upper surface 392 of the electrostatic chuck 350.

The chucking electrode 310 may be configured as a monopolar or bipolar electrode, or have another suitable arrangement. The chucking electrode 410 may be coupled through an RF filter 414 to the chucking power source 412, which provides direct current (DC) power to electrostatically secure the substrate 390 to the upper surface 392 of the electrostatic chuck 350. The RF filter 414 prevents RF power utilized to form plasma within the process chamber from damaging electrical equipment. The electrostatic chuck 350 may be fabricated from a ceramic material, such as AlN or $Al_2O_3$.

A power application system 420 is coupled to the substrate support assembly 346. The power application system 420 may include the heater power source 306, the chucking power source 412, a first radio frequency (RF) power source 430, and a second RF power source 440. Embodiments of the power application system 420 may additionally include the controller 310, and a sensor device 450 that is in communication with the controller 310 and both of the first RF power source 430 and the second RF power source 440. The controller 310 may also be utilized to control the plasma from the processing gas by application of RF power from the first RF power source 430 and the second RF power source 440 in order to deposit a layer of material on the substrate 390.

As described above, the electrostatic chuck 350 includes the chucking electrode 410 that may function in one aspect to chuck the substrate 390 while also functioning as a first RF electrode. The electrostatic chuck 350 may also include a second RF electrode 460, and together with the chucking electrode 410, may apply RF power to tune the plasma. The first RF power source 430 may be coupled to the second RF electrode 460 while the second RF power source 440 may be coupled to the chucking electrode 410. A first matching network and a second matching network may be provided for the first RF power source 430 and the second RF power source 440, respectively. The second RF electrode 460 may be a solid metal plate of a conductive material or a mesh of conductive material.

The first RF power source 430 and the second RF power source 440 may produce power at the same frequency or a different frequency. In some embodiments, one or both of the first RF power source 430 and the second RF power source 440 may independently produce power at a frequency of greater than or about 100 KHz, greater than or about 500 KHz, greater than or about 1 MHz, greater than or about 10 MHz, greater than or about 20 MHz, greater than or about 50 MHz, greater than or about 100 MHz, among other frequency ranges. Specific examples of frequencies of the power independently produced by RF power sources 430, 440 include 350 KHz, 2 MHz, 13.56 MHz, 27 MHz, 40 MHz, 60 MHz, 100 MHz, and 162 MHz, among other frequencies. RF power from one or both of the first RF power source 430 and second RF power source 440 may be varied in order to tune the plasma.

Figure 4:
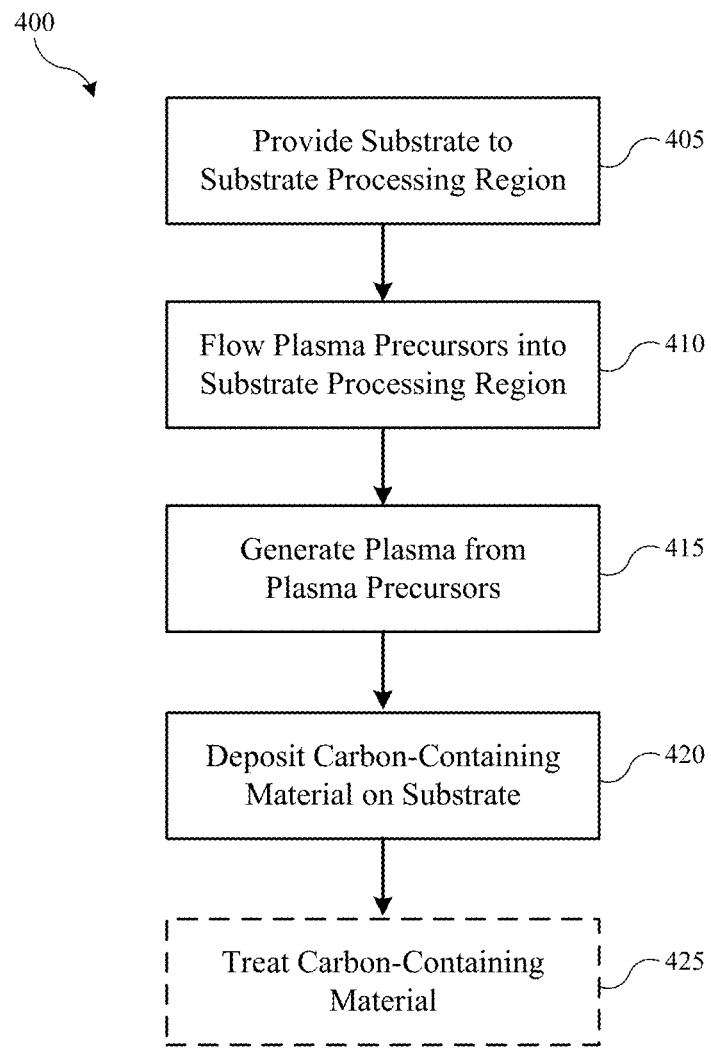
FIG. 4 shows operations in a semiconductor processing method according to some embodiments of the present technology.

FIG. 4 shows exemplary operations in a processing method 400 according to some embodiments of the present technology. The method may be performed in a variety of processing chambers, including processing systems 232 and 280 described above. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 400 may involve optional operations to develop the semiconductor structure to a particular fabrication operation. Although in some embodiments method 400 may be performed on a base structure, in some embodiments the method may be performed subsequent other material formation or removal. For example, any number of deposition, masking, or removal operations may be performed to produce any transistor, memory, or other structural aspects on a substrate. In some embodiments one or more structures formed on a substrate may be characterized by a thermal budget of less than or about 500° C., less than or about 450° C., less than or about 400° C., or less. Accordingly, method 400 and any subsequent operations may be performed at temperatures that are at or below the structural thermal budget. The substrate may be disposed on a substrate support, which may be positioned within a processing region of a semiconductor processing chamber. The operations to produce the underlying structures may be performed in the same chamber in which aspects of method 400 may be performed, and one or more operations may also be performed in one or more chambers on a similar platform as a chamber in which operations of method 400 may be performed, or on other platforms.

In some embodiments, method 400 may include providing a substrate in a substrate processing region of a substrate processing chamber 405. The substrate may have a temperature less than or about 50° C. in the substrate processing chamber. In some embodiments, the substrate temperature may be adjusted and maintained down to about 20° C. by heater elements in a substrate support assembly in the substrate processing chamber. In additional embodiments, the substrate temperature may be adjusted and maintained less than or about 20° C. by a cooling unit that delivers a cooling fluid to the substrate support assembly. Additional substrate temperature ranges include less than or about 40° C., less than or about 30° C., less than or about 20° C., less than or about 10° C., less than or about 0° C., less than or about −10° C., less than or about −20° C., less than or about −30° C., or less.

Exemplary substrates materials may include crystalline (e.g., Si<100> or Si<111>), silicon oxide, strained silicon, silicon germanium, doped or undoped polysilicon, doped or undoped silicon substrates and patterned or non-patterned substrates silicon on insulator (SOI), carbon-doped silicon oxides, silicon nitride, doped silicon, germanium, gallium arsenide, glass, and sapphire, among other substrate materials. The substrate may further include substrate features such as gaps, vias, trenches, steps, among other types of features. The substrate features may be formed directly in a base substrate. Alternatively, or in addition, the substrate features may be formed in layers of insulating, conductive, and/or semiconductive materials deposited on the base substrate that constitute part of the substrate in the substrate processing region during method 400. Exemplary substrates may take various shapes such as circular, rectangular or square, and may have dimensions of, for example, 200 mm, 300 mm, or 450 mm, in diameter, side, or diagonal.

Method 400 may further include flowing precursors into the substrate processing region of the substrate processing chamber containing the substrate 410. The precursors may include an inert precursor and a hydrocarbon-containing precursor. The flow rate ratio of the inert precursor to the hydrocarbon-containing precursor may be greater than or about 10:1, and may be greater than or about 20:1, greater than or about 30:1, greater than or about 40:1, greater than or about 50:1, or more. Exemplary flow rate ranges for the inert precursor may include more than or about 1000 sccm. Additional exemplary flow rate ranges for the inert precursor may include more than or about 1500 sccm, more than or about 2000 sccm, more than or about 2500 sccm, more than or about 3000 sccm, more than or about 3500 sccm, more than or about 4000 sccm, more than or about 4500 sccm, more than or about 5000 sccm, or more. Exemplary flow rates ranges for the hydrocarbon-containing precursor may include less than or about 50 sccm. Additional exemplary flow rate ranges may include less than or about 100 sccm, less than or about 75 sccm, less than or about 40 sccm, less than or about 30 sccm, less than or about 20 sccm, less than or about 10 sccm, less than or about 5 sccm, or less.

The dilution of the hydrocarbon-containing precursor in an excess of the inert precursor in the substrate processing region has been found to form an as-deposited layer of carbon-containing material on the substrate with a reduced level of stress when combined with higher plasma power. For example, when highly diluted precursors are provided with high plasma power, an increased plasma density may be produced that includes a greater amount of radical effluents that may facilitate modifying the as-deposited layer without being incorporated into the layer. By forming a bias plasma, such as generating plasma from bias power instead of applying a bias to a capacitively-coupled plasma, and by utilizing high bias power, increased ion impact may be afforded during deposition. When the precursors forming the plasma include higher dilution with inert gas as higher plasma powers are applied, the increased bombardment of the depositing material with high-energy inert ions may reduce the amount of stress in the as-deposited material by increasing hydrogen removal and the number of carbons having $sp^3$ bonding.

In some embodiments, the precursors supplied to the substrate processing region may generate and maintain a processing pressure in the substrate processing chamber of less than or about 100 mTorr. Additional exemplary processing pressure ranges include less than or about 1 Torr, less than or about 500 mTorr, less than or about 50 mTorr, less than or about 10 mTorr, less than or about 5 mTorr, less than or about 1 mTorr, less than or about 0.1 mTorr, or less, among other pressure ranges. By lowering the processing pressure in some embodiments, increased ion bombardment may occur by increasing the mean-free-path between atoms. This may increase the distance of travel between collisions, which may increase the energy and frequency of bombardment in the depositing material. This may further facilitate the reduction of hydrogen and increased carbon $sp^3$ bonding within the material, and reduce the level of stress in the as-deposited, carbon-containing layer.

Exemplary inert precursors may include at least one of helium, argon, and neon. Although any number of inert precursors may be utilized in some embodiments, by utilizing helium, reduced hydrogen and nitrogen incorporation within the layer may be maintained, while also reducing a sputtering component from larger inert precursors such as argon. Exemplary hydrocarbon-containing precursors may include acetylene ($C_2H_2$). Additional exemplary hydrocarbon-containing precursors may include hydrocarbon compounds having the general formula $C_xH_y$, where x has a range of between 1 and 20 and y has a range of between 1 and 20. Suitable hydrocarbon compounds include, for example, $C_3H_6$, $CH_4$, $C_4H_8$, 1,3-dimethyladamantane, bicyclo[2.2.1]hepta-2,5-diene (2,5-Norbornadiene), adamantine ($C_{10}H_{16}$), norbornene ($C_7H_{10}$), among other hydrocarbon compounds. In some embodiments, a carbon-to-hydrogen ratio may be maintained at less than or about 4:1, less than or about 3:1, less than or about 2:1, less than or about 1:1, or less, which may further facilitate limiting hydrogen incorporation during the deposition of the carbon-containing material.

Method 400 may further include generating a plasma from the precursors in the substrate processing region of the substrate processing chamber 415. The plasma may be generated by applying an RF bias power to the precursors in the substrate processing region. The RF bias power may be greater than 2000 Watts, and may be characterized by a frequency of from about 350 KHz to about 162 MHz (e.g., 350 KHz, 2 MHz, 13.56 MHz, 27 MHz, 40 MHz. 60 MHz, 100 MHz, or 162 MHz). As noted previously, some embodiments of the present technology may produce a bias plasma at a higher plasma power to improve film characteristics of the as-deposited material. For example, in some embodiments the bias plasma may be produced at a delivered power of greater than or about 2500 W, greater than or about 3000 W, greater than or about 3500 W, greater than or about 4000 W, greater than or about 4500 W, or greater. By increasing the plasma power, which may be performed in conjunction with increased inert precursor delivery, an amount of bombardment from the inert precursor may be produced, which may modify the deposited materials to improve carbon bonding and reduce hydrogen incorporation. Referring to FIG. 3 above, in some embodiments the RF bias power may be delivered to the precursors in the substrate processing region by the electrostatic chuck 350 that is supplied with RF power from the second RF power source 440. In additional embodiments, the RF bias power may also be supplied in whole or in part by the second electrode 460 in electronic communication with the first RF power source 430 that supplies a biasing voltage to the second RF electrode 460. The first RF power source 430 may produce power at a frequency of from about 350 KHz to about 100 MHz (e.g. 350 KHz, 2 MHz, 13.56 MHz, 27 MHz, 40 MHz, 60 MHz, or 100 MHz).

In some embodiments, operation 415 may further comprise applying a second RF bias power to the electrostatic chuck to independently control ion density and ion energy to modulate film stress. The second RF bias power may be greater than or about 10 Watts, and may have a frequency greater than or about 350 KHz. Referring to FIG. 3, in some embodiments, the second RF bias power is provided to the substrate 391 via the chucking electrode 410. The chucking electrode 410 may be in electronic communication with second RF power source 440 that supplies a biasing voltage to the chucking electrode 410. The second RF bias power may be provided at a power greater than or about 10 Watts. In some embodiments, the RF bias power and the second RF bias power may both be delivered to the precursors to generate a plasma during operation 415. In additional embodiments, the RF bias power may be delivered to the substrate via the chucking electrode 410, and the second RF bias power may be delivered via the second RF electrode 460.

The generated plasma deposits a carbon-containing material on the substrate in the substrate processing chamber at operation 420. The amount of material deposited may be a layer with an average thickness greater than or about 10 Å. Additional exemplary average thickness ranges may include greater than or about 50 Å, greater than or about 100 Å, greater than or about 1000 Å, greater than or about 5000 Å, greater than or about 10,000 Å, greater than or about 20,000 Å, or more.

The carbon-containing material may be deposited with low stress. Low stress materials are characterized by internal stress levels that are closer to neutral stress (i.e., 0 MPa). In contrast, high stress materials are characterized by internal stress levels that are significantly greater than 0 MPa (i.e., high positive (tensile) stress) or significantly less than 0 MPa (i.e., high negative (compressive) stress). High positive stress, which may be characterized as tensile stress, may be caused by the expansion of the material that creates an outward, pushing force on adjacent substrate features. High negative stress, which may be characterized as compressive stress, may be caused by the contraction of the material that creates an inward, pulling force on adjacent substrate features. In other words, higher-stress materials may be characterized by a stress level with an absolute value that is significantly greater than 0 MPa. Thus, when a material is characterized by a stress level of "greater than −1000 MPa", this refers to the absolute value of the stress level, and includes levels such as −1500 MPa, −2000 MPa, etc. Similarly, when a material is characterized by a stress level of "less than −1000 MPa", this refers stress levels that are closer to neutral stress (i.e., 0 MPa), and includes levels such as −500 MPa, −100 MPa, etc., but does not extend to positive values greater than or about 1000 MPa.

Exemplary stress values of the as-deposited material may include less than or about −500 MPa or less, where a stress value that is more negative means the material has more stress, and a stress value closer to 0 MPa has less stress. Additional exemplary stress value ranges may include less than or about −400 MPa, less than or about −300 MPa, less than or about −200 MPa, less than or about −100 MPa, less than or about −50 MPa, and less than or about −10 MPa, or less. While not intending to be bound by any particular theory about what causes the as-deposited material to be characterized by such low stress levels, it is believed that higher content of $sp^3$ hybridized carbons in the material, and lower amounts of hydrogen in the material, contribute to the formation of low-stress, carbon-containing layers. For example, in some embodiments, the percentage of $sp^3$ hybridized carbon atoms may include greater than or about 40%, greater than or about 50%, greater than or about 60%, greater than or about 70%, and greater than or about 80%, greater than or about 90%, or more. Additionally, in some embodiments, the amount of hydrogen incorporation within the deposited material may be maintained at less than or about 30 mol. %, and may be maintained at less than or about 25 mol. %, less than or about 20 mol. %, less than or about 15 mol. %, less than or about 10 mol. %, or less. These characteristics may facilitate reduced compressive stress within materials produced according to embodiments of the present technology.

The high content of $sp^3$ hybridized carbons in the material may make it a diamond-like-carbon material. Additional embodiments of the as-deposited carbon-containing material include amorphous carbon material and silicon-containing carbon, among other types of carbon-containing materials.

The Young's modulus of the deposited material may also be impacted by embodiments of the present processing methods. In some embodiments, the as-deposited material may be characterized by a modulus of greater than or about 150 GPa, and may be characterized by a modulus of greater than or about 160 GPa, greater than or about 170 GPa, greater than or about 180 GPa, greater than or about 190 GPa, greater than or about 200 GPa, or more.

Method 400 may optionally include treating the as-deposited carbon-containing material formed on the substrate 425. Embodiments of treatment operations may include polishing, etching, patterning, and curing the as-deposited layer of carbon-containing material, among other types of treatments. In some embodiments, the carbon-containing material may be exposed to hydrogen radicals during deposition and/or as-deposited on the substrate. In some embodiments, the hydrogen radicals may be generated in a remote-plasma-system (RPS) positioned outside the processing chamber and substrate processing region. The RPS-generated hydrogen radicals are then delivered to the substrate processing region of the substrate processing chamber, where they can mix and react with the plasma effluents and/or the deposited material. In some embodiments, the hydrogen radicals react with carbons having $sp^2$ hybridization and convert them into additional $sp^3$ hybridized carbons.

The embodiment described in method 400 forms a low-stress carbon-containing materials that may be useful as, for example, hardmask layers in the fabrication of semiconductor devices. The low-stress in the as-deposited layers allow them to be deposited without placing excessive stress on adjacent (e.g., underlying) substrate structures that may cause those structures to further distort, or cause the mask layer to fracture due to increased stress. The carbon-containing layers may also have excellent optical and etch-selectivity properties that make them well suited as hardmasks.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a substrate in a substrate processing region of a substrate processing chamber, wherein the substrate is maintained at a temperature less than or about 50° C.;
flowing an inert precursor and a hydrocarbon-containing precursor into the substrate processing region of the substrate processing chamber, wherein a flow rate ratio of the inert precursor to the hydrocarbon-containing precursor is greater than or about 10:1;
generating a plasma from the inert precursor and the hydrocarbon-containing precursor; and
depositing a carbon-containing material from the plasma on the substrate.

2. The semiconductor processing method of claim 1, wherein the hydrocarbon-containing precursor is flowed at a flow rate of less than or about 50 sccm.

3. The semiconductor processing method of claim 1, wherein the inert precursor is flowed at a flow rate of more than or about 1000 sccm.

4. The semiconductor processing method of claim 1, wherein the substrate processing chamber is maintained at a pressure of less than or about 100 mTorr.

5. The semiconductor processing method of claim 1, wherein the carbon-containing material is deposited at an average thickness greater than or about 10 Å.

6. The semiconductor processing method of claim 1, wherein the hydrocarbon-containing precursor comprises acetylene.

7. The semiconductor processing method of claim 1, wherein the inert precursor comprises at least one of helium or argon.

8. The semiconductor processing method of claim 1, wherein the plasma is a bias plasma formed at a bias power greater than 2000 Watts.

9. The semiconductor processing method of claim 1, wherein the carbon-containing material is characterized by an as-deposited stress that is less than or about −500 MPa.

10. A semiconductor processing method comprising:
providing a substrate in a substrate processing region of a substrate processing chamber, wherein the substrate is maintained at a temperature less than or about 50° C.;
generating a plasma from a deposition precursor comprising a hydrocarbon-containing precursor in the substrate processing region of the substrate processing chamber, wherein the plasma is a bias plasma generated at a bias power of greater than or about 3000 W, wherein the deposition precursor further comprises an inert precursor, and wherein a flow rate ratio of the inert precursor to the hydrocarbon-containing precursor is greater than or about 10:1; and
depositing a carbon-containing material from the plasma on the substrate.

11. The semiconductor processing method of claim 10, wherein the bias power is greater than or about 4000 Watts.

12. The semiconductor processing method of claim 10, wherein the bias power is delivered at an operating frequency less than or about 13.56 MHz.

13. A semiconductor processing method comprising:
generating a plasma from a hydrocarbon-containing precursor in a substrate processing region of a substrate processing chamber; and
depositing a carbon-containing material from the plasma on a substrate in the substrate processing region of the substrate processing chamber, wherein the carbon-containing material is characterized by an as-deposited stress that is less than or about −500 MPa, and wherein the carbon-containing material comprises less than or about 25 mol % hydrogen.

14. The semiconductor processing method of claim 13, wherein the substrate is maintained at a temperature less than or about 50° C.

15. The semiconductor processing method of claim 13, wherein the plasma is also generated from an inert precursor comprising at least one of helium or argon, and wherein a flow rate ratio of the inert precursor to the hydrocarbon-containing precursor is greater than or about 10:1.

16. The semiconductor processing method of claim 13, wherein the carbon-containing material comprises greater than or about 60% carbon atoms with $sp^3$ hybridized bonds.

17. The semiconductor processing method of claim 13, wherein the carbon-containing material comprises a diamond-like carbon.

* * * * *